(12) United States Patent
An et al.

(10) Patent No.: US 12,495,703 B2
(45) Date of Patent: Dec. 9, 2025

(54) PACKAGING STRUCTURE, FABRICATION METHOD THEREOF, AND DISPLAY APPARATUS

(71) Applicant: BOE TECHNOLOGY GROUP CO., LTD., Beijing (CN)

(72) Inventors: Che An, Beijing (CN); Wenqi Liu, Beijing (CN); Zhongyuan Sun, Beijing (CN); Wei Huang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 135 days.

(21) Appl. No.: 17/911,730

(22) PCT Filed: Oct. 29, 2021

(86) PCT No.: PCT/CN2021/127562
§ 371 (c)(1),
(2) Date: Sep. 15, 2022

(87) PCT Pub. No.: WO2022/193671
PCT Pub. Date: Sep. 22, 2022

(65) Prior Publication Data
US 2024/0224732 A1   Jul. 4, 2024

(30) Foreign Application Priority Data
Mar. 19, 2021 (CN) .......... 202110299898.7

(51) Int. Cl.
*H10K 59/80*   (2023.01)
*H10K 50/115*  (2023.01)
(Continued)

(52) U.S. Cl.
CPC ....... *H10K 59/8731* (2023.02); *H10K 50/115* (2023.02); *H10K 50/844* (2023.02);
(Continued)

(58) Field of Classification Search
None
See application file for complete search history.

(56) References Cited

U.S. PATENT DOCUMENTS

2017/0018737 A1   1/2017 Kim et al.

FOREIGN PATENT DOCUMENTS

| CN | 102683381 A | 9/2012 |
| CN | 107731868 A | 2/2018 |

(Continued)

OTHER PUBLICATIONS

China Patent Office, CN202110299898.7, First Office Action, Nov. 27, 2024.
(Continued)

*Primary Examiner* — Anthony Ho
(74) *Attorney, Agent, or Firm* — HOUTTEMAN LAW LLC (57) ABSTRACT

Disclosed are a packaging structure, a fabrication method thereof, and a display apparatus. The packaging structure includes: a first base; a packaging body on the first base; and a first packaging layer on a side of the packaging body away from the first base and including at least two inorganic layers sequentially stacked, wherein the at least two inorganic layers include a first inorganic layer closest to the packaging body, and the first inorganic layer contains carbon atoms and nitrogen atoms.

19 Claims, 3 Drawing Sheets

(51) Int. Cl.
*H10K 50/844* (2023.01)
*H10K 50/858* (2023.01)
*H10K 59/38* (2023.01)
*H10K 71/16* (2023.01)
*H10K 102/00* (2023.01)

(52) U.S. Cl.
CPC ........... *H10K 50/858* (2023.02); *H10K 59/38* (2023.02); *H10K 59/8792* (2023.02); *H10K 71/16* (2023.02); *H10K 2102/351* (2023.02)

(56) References Cited

FOREIGN PATENT DOCUMENTS

| CN | 108539051 A | 9/2018 |
| CN | 109841758 A | 6/2019 |
| CN | 110164308 A | 8/2019 |
| CN | 111540766 A | 8/2020 |
| CN | 112310318 A | 2/2021 |
| CN | 216488147 U | 5/2022 |

OTHER PUBLICATIONS

China Patent Office, CN202120570586.0, First Office Action, Aug. 23, 2021.
China Patent Office, CN202120570586.0, Second Office Action, Nov. 11, 2021.

PACKAGING STRUCTURE, FABRICATION METHOD THEREOF, AND DISPLAY APPARATUS

CROSS-REFERENCE TO RELATED APPLICATION

This is a National Phase Application filed under 35 U.S.C. 371 as a national stage of PCT/CN2021/127562, filed on Oct. 29, 2021, an application claiming the benefit of priority to Chinese Patent Application No. 202110299898.7 filed on Mar. 19, 2021 filed in the National Intellectual Property Administration, PRC the contents of which are incorporated herein in their entirety by reference.

TECHNICAL FIELD

The present disclosure relates to the field of display technology, and in particular relates to a packaging structure, a fabrication method thereof, and a display apparatus.

BACKGROUND

In use, a color conversion structure, such as a quantum dot layer, and a photoelectric conversion structure, need to be packaged. In recent years, quantum dot materials, due to their excellent properties, have been applied to various fields, and especially in the display field, display products in which a quantum dot film is combined with an organic light-emitting diode (OLED) have become the research focus. However, the quantum dot material is sensitive to water and oxygen, cannot be used independently and needs to be packaged.

SUMMARY

To solve at least one of the problems in the related art, the present disclosure provides a packaging structure, a fabrication method thereof, and a display apparatus.

The present disclosure provides a packaging structure, including: a first base; a packaging body on the first base; and a first packaging layer on a side of the packaging body away from the first base and including at least two inorganic layers sequentially stacked, where the at least two inorganic layers include a first inorganic layer closest to the packaging body, and the first inorganic layer contains carbon atoms and nitrogen atoms.

In some embodiments, the first inorganic layer is made of a material including $SiC_xN_y$, where $0<x\leq2$ and $0<y\leq2$.

In some embodiments, the at least two inorganic layers further include a second inorganic layer made of a material including $SiN_n$, where $0<n\leq1$.

In some embodiments, $0.6<n<1$.

In some embodiments, the at least two inorganic layers further include a third inorganic layer, the third inorganic layer being on a side of the second inorganic layer away from the packaging body, or being between the second inorganic layer and the first inorganic layer; and the third inorganic layer is made of a material including $SiO_mN_g$, where $1<m\leq2$, and $0\leq g<0.7$.

In some embodiments, along a direction away from the packaging body, the at least two inorganic layers have sequentially increasing refractive indexes.

In some embodiments, the at least two inorganic layers comprise three inorganic layers, and along a direction away from the packaging body, refractive indexes of the three inorganic layers respectively range: from 1.3 to 1.6; from 1.4 to 1.8; and from 1.6 to 2.0.

In some embodiments, the first packaging layer has a thickness between 0.3 μm and 2 μm.

In some embodiments, the packaging body includes: a color conversion layer.

In some embodiments, the color conversion layer includes quantum dots.

In some embodiments, the packaging body includes a light-emitting structure, and the light-emitting structure includes a light-emitting layer.

In some embodiments, the light-emitting layer includes quantum dots or an organic light-emitting material.

In some embodiments, the light-emitting structure further includes: a first cathode, an electron transport layer, a hole transport layer, and a first anode sequentially stacked, and the light-emitting layer is disposed between the electron transport layer and the hole transport layer.

An embodiment of the present disclosure further provides a display apparatus, including: the packaging structure as described above.

An embodiment of the present disclosure further provides a display apparatus, including: the packaging structure as described above, wherein the display apparatus further includes: a plurality of light-emitting devices each configured to emit light of a preset color; and the color conversion layer includes a plurality of light-exiting parts each corresponding to one of the light-emitting devices and disposed on a light-emitting side of a corresponding light-emitting device, and wherein each light-exiting part is configured to receive light emitted by the corresponding light-emitting device, and emit light of the same color as or a different color from the preset color.

In some embodiments, the light-emitting device is disposed between the color conversion layer and the first base.

In some embodiments, the display apparatus further includes: a second base opposite to the first base, the light-emitting device is disposed on the second base, the color conversion layer is disposed on a side of the first base facing the second base, and the first packaging layer is disposed between the color conversion layer and the light-emitting device.

In some embodiments, the preset color is blue, the plurality of light-exiting parts of the color conversion layer constitute a plurality of repetitive units, each repetitive unit including: a red light-exiting part configured to emit red light, a green light-exiting part configured to emit green light, and a blue light-exiting part configured to emit blue light.

In some embodiments, the display apparatus further includes: a second packaging layer covering the plurality of light-emitting devices; and a receiving structure layer on a side of the second packaging layer away from the light-emitting devices, wherein the receiving structure layer has a plurality of receiving slots therein in one-to-one correspondence with the plurality of light-emitting devices, and the light-exiting parts are disposed in the receiving slots.

In some embodiments, the display apparatus further includes: a color filter layer on a side of the color conversion layer away from the light-emitting devices, wherein the color filter layer includes a plurality of color filter parts each corresponding to one of the light-exiting parts and having the same color as light emitted from a corresponding light-exiting part; and a black matrix on the side of the color conversion layer away from the light-emitting devices, wherein an orthogonal projection of at least a part of each light-exiting part on the first base does not overlap an orthogonal projection of the black matrix on the first base.

An embodiment of the present disclosure further provides a method for preparing a packaging structure, including: forming a packaging body on a first base; and forming a first packaging layer on a side of the packaging body away from the first base; wherein forming the first packaging layer includes: sequentially forming at least two inorganic layers, where the at least two inorganic layers include a first inorganic layer closest to the packaging body, and the first inorganic layer contains carbon atoms and nitrogen atoms.

In some embodiments, each inorganic layer is formed by a vapor deposition process.

BRIEF DESCRIPTION OF DRAWINGS

Accompanying drawings are provided for further understanding of the present disclosure and constitute a part of the specification. Hereinafter, these drawings are intended to explain the present disclosure together with the following specific implementations, but should not be considered as a limitation to the present disclosure. In the drawings.

DETAIL DESCRIPTION OF EMBODIMENTS

To make the objects, technical solutions and advantages of the present disclosure clearer, the technical solutions in the embodiments of the present disclosure will now be described clearly and completely with reference to the accompanying drawings of the embodiments of the present disclosure. Obviously, the described embodiments are only a part, not all, of the embodiments of the present disclosure. Based on the described embodiments of the present disclosure, all the other embodiments obtained by those ordinary skilled in the art without any creative labor fall into the protection scope of the present disclosure.

The term used herein to describe embodiments of the present disclosure is not intended to limit and/or define the scope of the present disclosure. For example, unless otherwise defined, technical or scientific terms used in the present disclosure are intended to have general meanings as understood by those of ordinary skill in the art. It should be understood that the words "first", "second" and similar words used in the present disclosure do not denote any order, quantity, or importance, but are used merely for distinguishing different components. The singular forms "a," "an, "the" and other similar referents do not denote a limitation of quantity, but rather denote the presence of at least one, unless the context clearly dictates otherwise. Words like "comprising" or "including" means that the element or item preceding the word includes elements or items that appear after the word or equivalents thereof, but does not exclude other elements or items. Words like "upper", "lower", "left", "right" are merely used to indicate a relative positional relationship, and when an absolute position of the described object is changed, the relative positional relationship may also be changed accordingly.

In use of a color conversion structure, such as a quantum dot layer, and a photoelectric conversion structure, these structures need to be packaged to be protected from invasion of external water and oxygen. Taking the quantum dot layer as an example, since the quantum dot material is sensitive to water molecules and oxygen, the quantum dot film layer needs to be packaged in use. In an example, the packaging method includes: mixing the quantum dot material with a silica gel, such that the quantum dot material is wrapped by the silica gel, so a package effect is achieved with the water and oxygen blocking characteristic of the silica gel. However, this packaging method cannot completely eliminate invasion of small molecules such as water molecules and oxygen. In another example, the packaging method includes: packaging the quantum dot layer by an organic film layer; or, packaging the quantum dot layer by a packaging layer consisting of two inorganic film layers and an organic film layer between the two inorganic film layers. However, in this packaging method, the formed organic film layer has a relatively large thickness due to limitations in the fabrication process of the organic film layer, resulting in a relatively large overall thickness of the packaging layer, which is unfavorable for application of the quantum dot layer in the display apparatus.

Figure 1A:
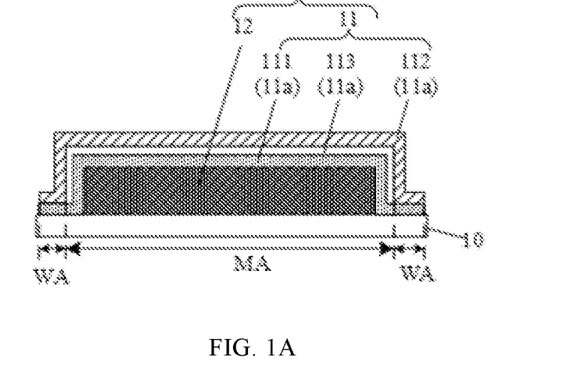
FIG. 1A is a schematic diagram of a packaging structure according to an embodiment of the present disclosure.

FIG. 1A is a schematic diagram of a packaging structure according to an embodiment of the present disclosure. As shown in FIG. 1A, the packaging structure 1 includes: a first base 10, and a packaging body 12 and a first packaging layer 11 on the first base 10. The packaging body 12 may include a color conversion layer, an electroluminescent structure, or a photoelectric conversion structure. The first packaging layer 11 is disposed on a side of the packaging body 12 away from the first base 10, and includes a plurality of inorganic layers 11a sequentially stacked, including a first inorganic layer 111 closest to the packaging body 12. The first inorganic layer 111 contains carbon atoms and nitrogen atoms. A surface of the packaging body 12 facing the first inorganic layer 111 may be in direct contact with the first inorganic layer 111.

In an embodiment of the present disclosure, the first packaging layer 11 includes a plurality of inorganic layers 11a which may be formed through a vapor deposition process, so as to obtain the first packaging layer 11 with a smaller thickness and thus facilitate a thin packaging structure 1. In addition, the first inorganic layer 111 closest to the packaging body 12 contains carbon atoms and nitrogen atoms to form an organic-like film layer with a relatively small stress, which is beneficial to achieve stress matching between the first inorganic layer 111 and the packaging body 12, so that stress release of the packaging body 12 over time can be balanced, and cracks in the first inorganic layer 111 and thus rupture of other inorganic layers 11a can be prevented. Therefore, the packaging structure 1 in the embodiment of the present disclosure is beneficial to achieving a thin structure on the basis of ensuring the product quality.

In some embodiments, the packaging body 12 includes: a color conversion layer configured to emit, under irradiation of source light, light the same as, or different from, the source light. For example, the color conversion layer includes perovskite. For another example, the color conversion layer includes quantum dots. For yet another example, the color conversion layer includes a fluorescent material or a phosphorescent material, including, for example, a red fluorescent material and a green fluorescent material. The red fluorescent material may include at least one of (Ca, Sr,Ba)S, $(Ca,Sr,Ba)_2Si_5N_8$, CASN ($CaAlSiN_3$), $CaMoO_4$ and $Eu_2Si_5N_8$; and the green fluorescent material may include at least one of yttrium aluminum garnet (YAG), (Ca, Sr,Ba)$_2SiO_4$, $SrGa_2S_4$, BAM, α-SiAlON, β-SiAlON, $Ca_3Sc_2Si_3O_{12}$, $Tb_3A_{15}O_{12}$, $BaSiO_4$, CaAlSiON and (Sr1-xBax)$Si_2O_2N_2$, where x is a number between 0 and 1.

Figure 1B:
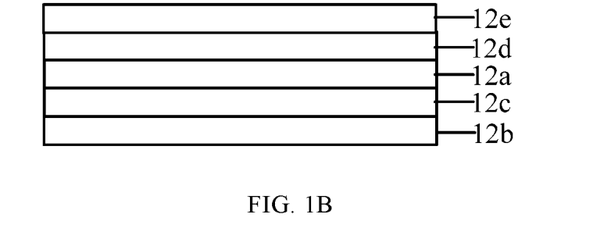
FIG. 1B is a schematic structural diagram of a packaging body according to some other embodiments of the present disclosure.

FIG. 1B is a schematic structural diagram of a packaging body according to some other embodiments of the present disclosure. As shown in FIG. 1B, in some other embodiments, the packaging body 12 includes: a light-emitting structure including a light-emitting layer 12a, and the light-emitting layer 12a includes a quantum dot material, an organic light-emitting material, or a perovskite material. The organic light-emitting material includes: one or more of 8-hydroxyquinoline aluminum, mCBP, DPEPO, m-ADN or Ir(ppy)$_3$. In addition, the light-emitting structure further includes: a first cathode 12b, an electron transport layer 12c, a hole transport layer 12d, and a first anode 12e. The first cathode 12b is disposed opposite to the first anode 12e, the light-emitting layer 12a is disposed between the first anode 12e and the first cathode 12b, the electron transport layer 12c is disposed between the light-emitting layer 12a and the first cathode 12b, and the hole transport layer 12d is located between the light-emitting layer 12a and the first anode 12e. Apparently, the light-emitting structure may further include other film layers, for example, an electron injection layer between the electron transport layer 12c and the first cathode 12b, and/or a hole injection layer between the hole transport layer 12d and the first anode 12e. In addition, it should be noted that it is possible that the first cathode 12b and the electron transport layer 12c are disposed between the light-emitting layer 12a and the first base 10, and the first anode 12e and the hole transport layer 12d are disposed on a side of the light-emitting layer 12a away from the first base 10, or it is also possible that the first cathode 12b and the electron transport layer 12c are disposed on a side of the light-emitting layer 12a away from the first base 10, and the first anode 12e and the hole transport layer 12d are disposed between the light-emitting layer 12a and the first base 10.

According to the above embodiments, the packaging body 12 may include a color conversion layer or a light-emitting layer, each of which may include quantum dot material. The quantum dot material may include one or more of $ZnCdSe_2$, CdSe, CdTe, InP or InAs; and the quantum dot material is not limited to the above materials, and may be selected from group II-VI compounds, group III-V compounds, group IV-VI compounds, group IV elements, group IV compounds, and/or combinations thereof.

It should be noted that, in the embodiment of the present disclosure, the packaging body 12 is not limited to the light-emitting structure and the color conversion layer as described above. For example, the packaging body 12 may include a photoelectric conversion structure. The photoelectric conversion structure may include a dye-sensitized cell, a quantum dot-sensitized solar cell, a perovskite solar cell, or a photodetector device.

In some embodiments, the first packaging layer 11 having the stacked plurality of inorganic layers may have an overall thickness between 0.3 μm to 2 μm. Therefore, compared with the first packaging layer 11 including an organic film layer, the packaging structure 1 has a relatively small thickness and can be favorably applied to a display apparatus.

In some embodiments, the inorganic layers 11a of the first packaging layer 11 include: a first inorganic layer 111, and a second inorganic layer 112 on a side of the first inorganic layer 111 away from the quantum dot layer 12 (i.e., the packaging body).

The first inorganic layer 111 is made of a material including: $SiC_xN_y$, where $0<x\leq 2$ and $0<y\leq 2$. $SiC_xN_y$ indicates that in $SiC_xN_y$, a molar ratio of silicon (Si) to carbon (C) is 1:x, and a molar ratio of silicon (Si) to nitrogen (N) is 1:y. Optionally, $0.3<x\leq 1.8$, and $0.1<y\leq 1.8$. Optionally, $0.4<x\leq 1.7$, and $0.2<y\leq 1.5$. Optionally, $0.5<x\leq 1.7$, and $0.2<y\leq 1.3$. Preferably, $0.6<x<1.7$, and $0.3<y<1$, so that the first inorganic layer 111 can better balance the stress release of the quantum dot layer 12. The first inorganic layer 111 has a thickness less than or equal to 1 μm, and a stress on the first inorganic layer 111 may be between −10 and 10 MPa.

The second inorganic layer 112 is made of a material including a compound of silicon and nitrogen atoms, which may be denoted as $SiN_n$ and functions to block water molecules and oxygen, where $0<n\leq 1$. $SiN_n$ indicates that in $SiN_n$, a molar ratio of silicon (Si) to nitrogen (N) is 1:n. Preferably, the $SiN_n$ material may contain no other elements, or other elements may exist as impurities and may be neglected. Optionally, $0.2<n\leq 1$. Optionally, $0.3<n<1$. Preferably, $0.6<n<1$, and in this case, the second inorganic layer 112 has a dense membrane and a relatively high Young's modulus, but less internal defects. Therefore, it is ensured that the second inorganic layer 112 has a water vapor transmission rate (WVTR) less than $10^{-4}$ and thus has a stable structure, thereby improving reliability of the packaging structure 1. Optionally, the second inorganic layer 112 has a thickness between 0.5 μm and 0.9 μm.

In some embodiments, the inorganic layers 11a of the first packaging layer 11 further include a third inorganic layer 113 on a side of the second inorganic layer 112 away from the packaging body 12, or a third inorganic layer 113 between the second inorganic layer 112 and the first inorganic layer 111.

When the inorganic layers 11a of the first packaging layer 11 include the third inorganic layer 113, one of the second inorganic layer 112 and the third inorganic layer 113 may be subjected to a tensile stress, while the other may be subjected to a compressive stress. In this case, the stresses on the second inorganic layer 112 and the third inorganic layer 113 may be neutralized, so that the second inorganic layer 112 and the third inorganic layer 113 are more fitted, and peeling between the film layers is prevented.

In some embodiments, the third inorganic layer 113 is an inorganic film layer containing oxygen atoms. Specifically, the third inorganic layer 113 may be made of a material including $SiO_mN_g$, where $1<m\leq 2$, and $0\leq g<0.7$. $SiO_mN_g$ indicates that in $SiO_mN_g$, a molar ratio of silicon (Si), oxygen (O), and nitrogen (N) is 1:m:g, where when g=0, the inorganic layer is silicon oxide. Optionally, the third inorganic layer 113 has a thickness between 0.1 μm and 0.3 μm.

In the above embodiments, the second inorganic layer 112 may be subjected to a tensile stress, and in this case the third inorganic layer 113 may be subjected to a compressive stress; or, the second inorganic layer 112 may be subjected to a compressive stress, and in this case the third inorganic layer 113 may be subjected to a tensile stress, which is not limited in the present disclosure as long as the stress balance between the second inorganic layer 112 and the third inorganic layer 113 is ensured. The stress on the film layer may be associated with various factors such as the fabrication conditions, thickness, composition, or the like.

Preferably, in order to improve the water and oxygen barrier effect of the first packaging layer 11, the second inorganic layer 112 is in contact with an edge of the first inorganic layer 111, and an orthographic projection of the second inorganic layer 112 on the first base 10 covers an orthographic projection of the packaging body 12 on the first base 10.

Preferably, when the third inorganic layer 113 is disposed between the second inorganic layer 112 and the first inorganic layer 111, the orthographic projection of the second inorganic layer 112 on the first base 10 covers an orthographic projection of the third inorganic layer 113 on the first base 10. Further preferably, the orthographic projection of the third inorganic layer 113 on the first base 10 covers the orthographic projection of the packaging body 12 on the first base 10. Specifically, as shown in FIG. 1A, the second inorganic layer 112 may include $SiN_n$, and the packaging structure 1 includes a central region MA and an edge region WA surrounding the central region MA. The packaging body 12 is located in the central region MA, the first inorganic layer 111 is in contact with the second inorganic layer 112 in the edge region WA, the orthographic projection of the second inorganic layer 112 on the first base 10 covers the orthographic projection of the third inorganic layer 113 on the first base 10, and the orthographic projection of the third inorganic layer 113 on the first base 10 covers the orthographic projection of the packaging body 12 on the first base 10.

Figure 2:
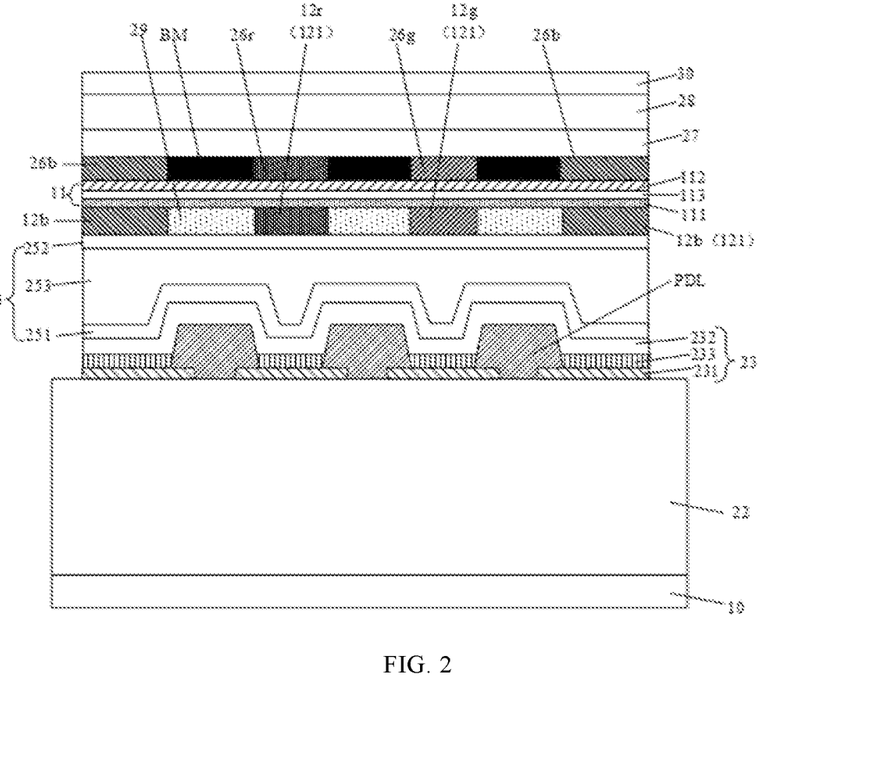
FIG. 2 is a schematic diagram of a display apparatus according to some embodiments of the present disclosure.

An embodiment of the present disclosure further provides a display apparatus, which may be an OLED display panel, a QLED display panel, a mobile phone, a tablet, a television, a monitor, a laptop, a digital album, a navigator or any other product or component having a display function. FIG. 2 is a schematic diagram of a display apparatus according to some embodiments of the present disclosure. As shown in FIG. 2, the display apparatus includes: the quantum dot structure described in any of the above embodiments. The display apparatus further includes: a driving structure layer 22 and a plurality of light-emitting devices 23 on the first base 10. The first base 10 may be a glass substrate, or may be a flexible substrate made of a flexible material such as polyimide (PI), so as to facilitate flexible display. The driving structure layer 22 includes a plurality of pixel driving circuits in one-to-one correspondence with the light-emitting devices 23 and configured to provide driving currents for the light-emitting devices 23 to drive the light-emitting devices 23 to emit light. For example, the pixel driving circuit includes a plurality of thin film transistors (as shown in FIG. 3) and at least one capacitor.

Figure 3:
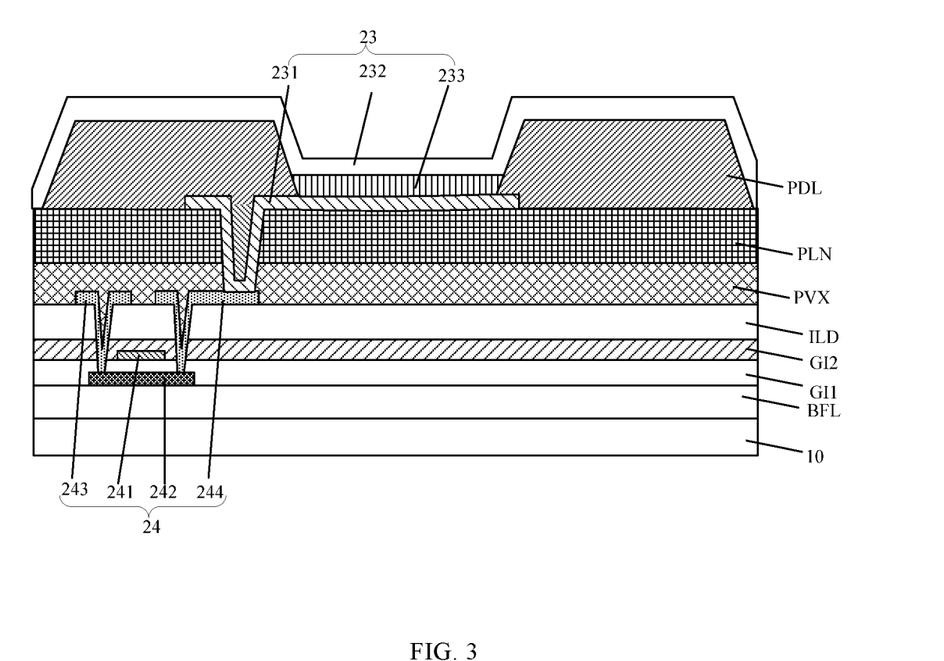
FIG. 3 is a schematic diagram of a driving structure layer according to some embodiments of the present disclosure.

FIG. 3 is a schematic diagram of a driving structure layer according to some embodiments of the present disclosure. As shown in FIG. 3, a thin film transistor 24 includes a gate electrode 241, an active layer 242, a source electrode 243 and a drain electrode 244. Taking the thin film transistor 24 being a top-gate type of thin film transistor as an example, the active layer 242 is disposed between the gate electrode 241 and the first base 10. The active layer 242 may be made of a material including, for example, an inorganic semiconductor material (e.g., polysilicon, amorphous silicon, etc.), an organic semiconductor material, or an oxide semiconductor material. The active layer 242 includes a channel part, and a source connection part and a drain connection part on two sides of the channel part. The source connection part is coupled to the source electrode 243 of the thin film transistor 24, and the drain connection part is coupled to the drain electrode 244 of the thin film transistor 24. Each of the source connection part and the drain connection part may be doped with an impurity (e.g., an N-type impurity or P-type impurity) having a higher impurity concentration than an impurity in the channel part. The channel part directly faces the gate electrode 241 of the thin film transistor 24, and when a voltage signal loaded on the gate electrode 241 reaches a predetermined value, a carrier path is formed in the channel part such that the source electrode 243 of the thin film transistor 24 is communicated with the drain electrode 244 of the thin film transistor 24.

A buffer layer BFL is disposed between the thin film transistor 24 and the first base 10, and configured to prevent or reduce diffusion of metal atoms and/or impurities from the first base 10 to the active layer 242 of the transistor. The buffer layer BFL may include an inorganic material such as silicon oxide, silicon nitride, and/or silicon oxynitride, and may be formed as a multi-layer or single-layer structure.

A first gate insulation layer GI1 is disposed on a side of the active layer 242 away from the buffer layer BFL, and may be made of a material including a silicon compound or a metal oxide. For example, the material of the first gate insulation layer GI1 includes silicon oxynitride, silicon oxide, silicon nitride, siloxicon, silicon carbonitride, aluminum oxide, aluminum nitride, tantalum oxide, hafnium oxide, zirconium oxide, titanium oxide, or the like. In addition, the first gate insulation layer GI1 may be a single-layer or multi-layer structure.

A gate electrode layer is disposed on a side of the first gate insulation layer GI1 away from the buffer layer BFL. The gate electrode layer includes a gate electrode 241 of each thin film transistor, and a first electrode plate of the capacitor. The gate electrode layer may be made of a material including, for example, a metal, a metal alloy, a metal nitride, a conductive metal oxide, a transparent conductive material, or the like. For example, the gate electrode layer may include gold, an alloy of gold, silver, an alloy of silver, aluminum, an alloy of aluminum, aluminum nitride, tungsten, tungsten nitride, copper, an alloy of copper, nickel, chromium, chromium nitride, molybdenum, an alloy of molybdenum, titanium, titanium nitride, platinum, tantalum, tantalum nitride, neodymium, scandium, strontium ruthenium oxide, zinc oxide, stannic oxide, indium oxide, gallium oxide, indium tin oxide, indium zinc oxide, or the like. The gate electrode layer may have a single-layer or multi-layer structure.

A second gate insulation layer GI2 is disposed on a side of the gate electrode layer away from the buffer layer BFL, and may be made of a material including, for example, a silicon compound or a metal oxide. For example, the material of the second gate insulation layer GI2 may include silicon oxynitride, silicon oxide, silicon nitride, siloxicon, silicon carbonitride, aluminum oxide, aluminum nitride, tantalum oxide, hafnium oxide, zirconium oxide, titanium oxide, or the like. The second gate insulation layer GI2 may be formed as a single-layer or multi-layer structure.

A conductive layer (not shown) is disposed on a side of the second gate insulation layer GI2 away from the buffer layer BFL, and may include a second electrode plate of the capacitor. The conductive layer may be made of the same material as the first electrode plate; specific reference may be made to the conductive materials listed above.

An interlayer insulation layer ILD is disposed on a side of the conductive layer away from the buffer layer BFL, and may be made of a material including, for example, a silicon compound, a metal oxide or the like. Specifically, any of the silicon compounds and metal oxides listed above may be selected, and will not be repeated here.

A source-drain conductive layer is disposed on a side of the interlayer insulation layer ILD away from the buffer layer BFL. The source-drain conductive layer may include the source electrode 243 and the drain electrode 244 of each transistor, the source electrode 243 is electrically coupled to the source connection part, and the drain electrode 244 is electrically coupled to the drain connection part. The source-drain conductive layer may include a metal, an alloy, a metal nitride, a conductive metal oxide, a transparent conductive material, or the like. For example, the source-drain conductive layer may be a single-layer or multi-layer structure formed by a metal, such as Mo/Al/Mo or Ti/Al/Ti.

A passivation layer PVX is disposed on a side of the source-drain conductive layer away from the buffer layer BFL, and may be made of a material including, for example, silicon oxynitride, silicon oxide, silicon nitride, or the like. A planarization layer PLN is disposed on a side of the passivation layer PVX away from the buffer layer BFL, and may be made of an organic insulating material. For example, the organic insulating material includes a resin-based material such as polyimide, epoxy, acryl, polyester, photoresist, polyacrylate, polyamide, siloxane, or the like.

A pixel defining layer PDL is disposed on a side of the planarization layer PLN away from the buffer layer BFL, and has a plurality of pixel openings. The light-emitting devices 23 are arranged in one-to-one correspondence with the pixel openings, and include: a first electrode 231, a second electrode 232, and a light-emitting function layer 233 between the first electrode 231 and the second electrode 232. For example, the first electrode 231 is an anode, and the second electrode 232 is a cathode. Optionally, the first electrode 231 is a reflective electrode made of a metal material, and the second electrode 232 is a transparent electrode made of a transparent conductive material (e.g., indium tin oxide). The light-emitting function layer 233 may include: a hole injection layer, a hole transport layer, a light-emitting layer, an electron transport layer, and an electron injection layer sequentially stacked. The first electrode 231 is disposed between the pixel defining layer PDL and the planarization layer PLN, and has a portion exposed from the pixel openings. Second electrodes 232 of the plurality of light-emitting devices 23 may be formed as an single piece.

Optionally, the light-emitting devices 23 are OLED devices, and in this case, the light-emitting layer is made of an organic light-emitting material; or, the light-emitting devices 23 are quantum dot light emitting diode (QLED) devices, and in this case, the light-emitting layer is made of a quantum dot light-emitting material. Each light-emitting device is configured to emit light of a preset color.

As shown in FIG. 2, the display apparatus further includes: a second packaging layer 25 and a receiving structure layer 29. The second packaging layer 25 covers the pixel defining layer PDL and the plurality of light-emitting devices 23, and is configured to package the light-emitting devices 23 to prevent the light-emitting devices 23 from invasion of water vapor and/or oxygen in the external environment. In some embodiments, the second packaging layer 25 includes a first inorganic packaging layer 251, a second inorganic packaging layer 252, and an organic packaging layer 253. The second inorganic packaging layer 252 is disposed on a side of the first inorganic packaging layer 251 away from the light-emitting devices 23, and the organic packaging layer 253 is disposed between the first inorganic packaging layer 251 and the second inorganic packaging layer 252. The first inorganic packaging layer 251 and the second inorganic packaging layer 252 may be both made of a high-density inorganic material such as silicon oxynitride, silicon oxide, or silicon nitride. The organic packaging layer 253 may be made of a high polymer (or molecular) material containing a desiccant, or a high polymer material capable of blocking water vapor. For example, a polymer resin is used so that stresses on the first inorganic packaging layer 251 and the second inorganic packaging layer 252 can be reduced, and a water absorbing material such as a desiccant may be further included to absorb water molecules and/or oxygen molecules penetrating inside.

The packaging body of the packaging structure is disposed on a side of the second packaging layer 25 away from the light-emitting devices 23. In some embodiments, the packaging body includes a plurality of color conversion layers including a plurality of light-exiting parts 121. Each light-exiting part 121 corresponds to one of the light-emitting devices 23 and is disposed on a light-emitting side of a corresponding light-emitting device 23 disposed between the light-exiting part 121 and the first base 10. Each light-exiting part 121 is configured to receive light emitted from the corresponding light-emitting device 23 and emit light of the same color as or a different color from the preset color.

In some embodiments, the light emitted by the light-emitting device 23 has a blue color. Optionally, the plurality of light-exiting parts 121 of the color conversion layer constitute a plurality of repetitive units, each repetitive unit including: a red light-exiting part 12r configured to emit red light, a green light-exiting part 12g configured to emit green light, and a blue light-exiting part 12b configured to emit blue light. Optionally, the blue light-exiting part 12b may include scattering particles; and the red light-exiting parts 12r and the green light-exiting parts 12g may each include quantum dots. Apparently, the red light-exiting part 12r or the green light-exiting part 12g may also include scattering particles.

The receiving structure layer 29 is disposed on a side of the second packaging layer 25 away from the first base 10, and has a plurality of receiving slots in one-to-one correspondence with the light-emitting devices 23. The light-exiting parts 121 are disposed in the receiving slots. The receiving structure layer 29 may be made of a material including: an acrylic polymer photoinitiator, an organic pigment, a resinous organic material, or a mixture thereof.

Since there is also ambient blue light, when the ambient blue light is incident into the quantum dot layer, the quantum dot layer 12 is excited to emit red or green light, thereby affecting the display effect of the display apparatus. In order to prevent the display apparatus from being interfered by the ambient light, in some embodiments, the display apparatus further includes a color filter layer and a black matrix BM. The color filter layer is disposed on a side of the color conversion layer away from the first base 10, and includes a plurality of color filter parts 26r, 26g and 26b, each corresponding to one of the light-exiting parts 121 and having the same color as light emitted from a corresponding light-exiting part 121. For example, the color filter part 26r corresponds to the red light-exiting part 12r, and thus is red; the color filter part 26g corresponds to the green light-exiting part 12g, and thus is green; and the color filter part 26b corresponds to the blue light-exiting part 12b, and thus is blue.

The black matrix BM is disposed on a side of the color conversion layer away from the first base 10, and is formed into a mesh structure to define a plurality of sub-pixel regions where the light-emitting devices 23 are located. An orthogonal projection of at least a part of each light-exiting part 121 on the first base 10 does not overlap an orthogonal projection of the black matrix BM on the first base 10.

Figure 4:
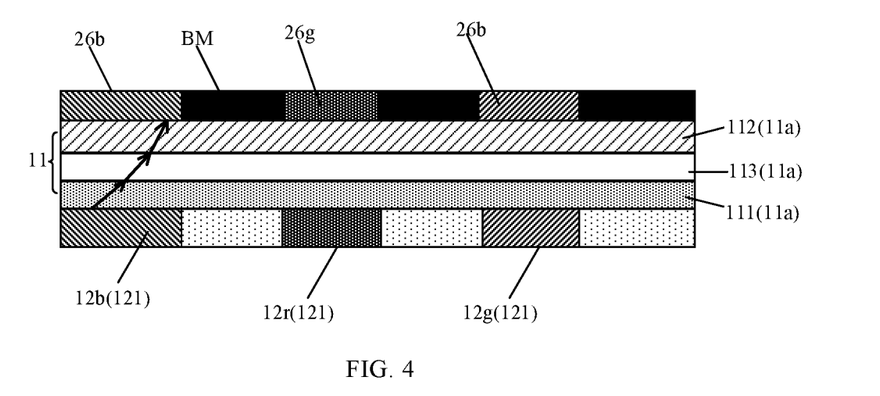
FIG. 4 is a schematic diagram showing light emitted from the packaging structure according an embodiment of the present disclosure.

In some embodiments, along a direction away from the color conversion layer, the plurality of inorganic layers 11a of the first packaging layer 11 have sequentially increasing refractive indexes, so as to reduce light loss. FIG. 4 is a schematic diagram showing light emitted from the packaging structure according an embodiment of the present disclosure. As shown, the first inorganic layer 111 has a refractive index lower than the third inorganic layer 113, and the third inorganic layer 113 has a refractive index lower than the second inorganic layer 112. In this case, when light emitted from the light-exiting parts 121 sequentially passes through the first inorganic layer 11, the third inorganic layer 113, and the second inorganic layer 112, an angle between a light-emitting direction and a thickness direction of the display apparatus is gradually reduced, so that light incident into the black matrix BM is reduced or prevented.

In some embodiments, for light with a wavelength between 440 nm and 450 nm, the first inorganic layer 11 has a refractive index between 1.3 and 1.6, the second inorganic layer 12 has a refractive index between 1.4 and 1.8, and the third inorganic layer 13 has a refractive index between 1.6 and 2.0, thereby minimizing light loss.

As shown in FIG. 2, a protective layer 27 is further disposed on a side of the color filter layer away from the first base 10, and configured to protect the color filter layer and structures below the color filter layer. On a side of the protective layer 27 away from the first base 10, an optical adhesive layer 28 and a cover plate 30 are provided, and the optical adhesive layer 28 is disposed between the protective layer 27 and the cover plate 30.

Figure 5:
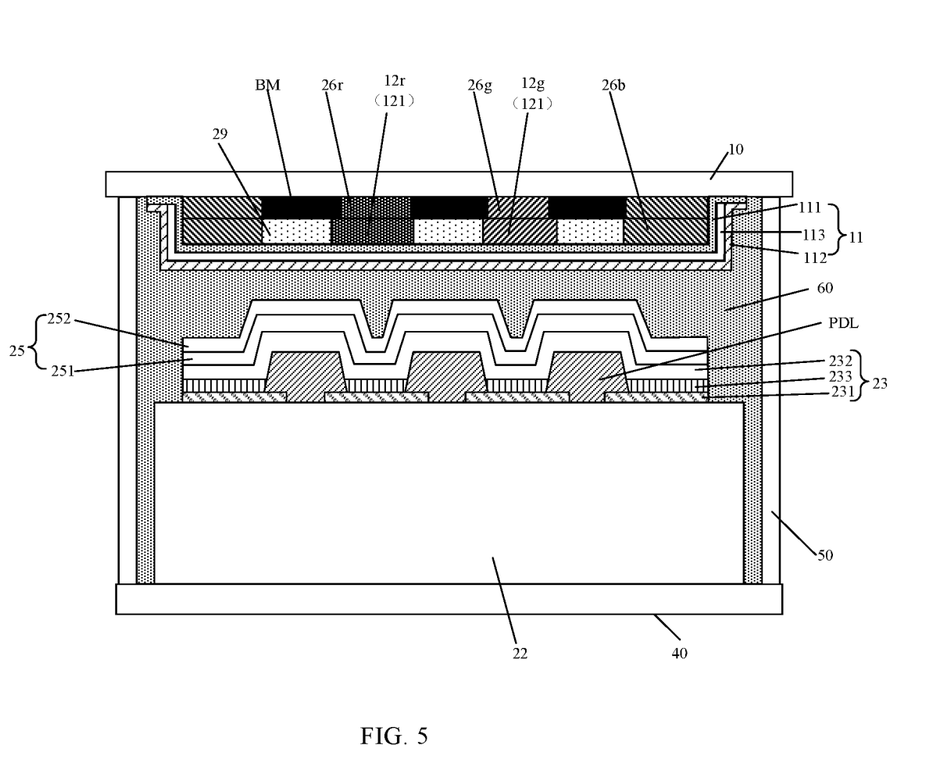
FIG. 5 is a schematic diagram of a display apparatus according to some other embodiments of the present disclosure.

FIG. 5 is a schematic diagram of a display apparatus according to some other embodiments of the present disclosure. Similar to the display apparatus shown in FIG. 4, the display apparatus shown in FIG. 5 includes a packaging structure, a driving structure layer 22, light-emitting devices 23, a color filter layer, and a black matrix BM. A packaging body of the packaging structure includes a color conversion layer including a plurality of light-exiting parts 121 each disposed on a light-emitting side of a corresponding light-emitting device 23 and in a receiving slot of a receiving structure layer 29. The specific structure of the light-emitting devices 23, the material of the light-exiting parts 121, the material of the receiving structure layer 29, and the specific structures of the driving structure layer 22 and the color filter layer are the same as those described in FIG. 4, and are not repeated here.

Unlike FIG. 4, in the display apparatus shown in FIG. 5, the driving structure layer 22 and the light-emitting devices 23 are disposed on the second base 40, and the driving structure layer 22 is disposed between the light-emitting devices 23 and the second base 40. The second base 40 is disposed opposite to the first base 10, and the second packaging layer 25 is disposed on a side of the light-emitting devices 23 away from the second base 40. The color conversion layer is disposed on a side of the first base 10 facing the second base 40, and the first packaging layer 11 is disposed between the color conversion layer and the light-emitting devices 23.

In addition, the color filter layer and the black matrix BM are disposed between the first packaging layer 11 and the first base 10, and the first packaging layer 11, while packaging the color conversion layer, may further package the color filter layer and the black matrix BM. A sealant 50 is further disposed between the first base 10 and the second base 40. The sealant 50 surrounds a display area of the display apparatus, a filling material 60 is further disposed in the display area, and at least a part of the filling material 60 is located between the second packaging layer 25 and the first packaging layer 11. In addition, since the filling material 60 and the sealant 50 may have a function of blocking water molecules and oxygen, the organic packaging layer between the first inorganic packaging layer 251 and the second inorganic packaging layer 252 of the second packaging layer 25 may be omitted.

When the display apparatus shown in FIG. 5 is fabricated, the color filter layer, the black matrix BM, the receiving structure layer 29, the color conversion layer, the first packaging layer 11, and the like may be firstly formed on the first base 10, then the driving structure layer 40, the light-emitting devices 23, and the second packaging layer 25 are formed on the second base 40, the sealant 50 and the filling material 60 are formed on at least one of the first base 10 or the second base 40, and then the first base 10 and the second base 40 are aligned and assembled to form the display apparatus shown in FIG. 5.

Figure 6:
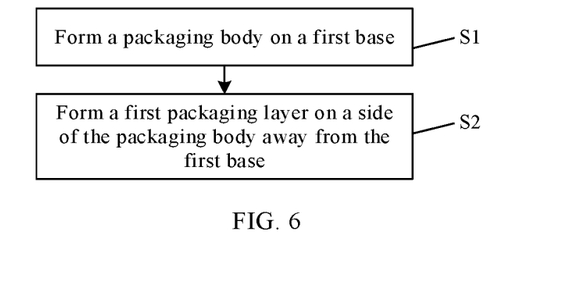
FIG. 6 is a flowchart of a method for fabricating a packaging structure according to some embodiments of the present disclosure.

FIG. 6 is a flowchart of a method for fabricating a packaging structure according to some embodiments of the present disclosure. As shown in FIG. 6, the method includes the following Steps S1 to S2.

At Step S1, a packaging body is formed on a first base.

At Step S2, a first packaging layer is formed on a side of the packaging body away from the first base. Specifically, Step S2 includes: sequentially forming a plurality of inorganic layers in stack. The plurality of multi-layer inorganic layers include a first inorganic layer closest to the packaging body. The first inorganic layer contains carbon atoms and nitrogen atoms.

The packaging structure may be a color conversion layer, which may include an organic light-emitting material or quantum dots. The color conversion layer may be formed directly on a flexible or rigid base; or structures including the light-emitting devices and the second packaging layer may be firstly formed on the first base, and then the color conversion layer is formed on the second packaging layer, thereby fabricating the structure shown in FIG. 4. Alternatively, structures including the color filter layer and the black matrix are firstly formed on the first base, and then the color conversion layer is formed on the color filter layer, thereby fabricating the structure shown in FIG. 5.

In some embodiments, each inorganic layer is formed by a vapor deposition (CVD) process, thereby facilitating reduction of the thickness of the inorganic layer. The inorganic layer formed by the vapor deposition process has good cladding performance, which is beneficial to improving reliability of the quantum dot structure. In the actual fabrication process, multiple inorganic layers may be continuously deposited in a CVD device, which is beneficial to saving the time for the whole process and reducing the process complexity. Apparently, in the actual fabrication process, it is also possible that after each inorganic layer is deposited, the base or the display apparatus may be removed from the deposition device, and then replaced into the deposition device for deposition of a next inorganic layer. By preparing the multiple inorganic layers by a same process, the production efficiency can be improved. Specifically, for example, the first packaging layer includes: a first inorganic layer, a third inorganic layer, and a second inorganic layer sequentially arranged in a direction away from the quantum dot layer. For example, each inorganic layer is deposited for 10 minutes or less, and the three inorganic layers are deposited for a total time of 30 minutes or less, thereby improving the production efficiency.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A packaging structure, comprising:
    a first base;
    a packaging body on the first base; and
    a first packaging layer on a side of the packaging body away from the first base and comprising at least two inorganic layers sequentially stacked, wherein the at least two inorganic layers comprise a first inorganic layer closest to the packaging body, and the first inorganic layer contains carbon atoms and nitrogen atoms,
    wherein the at least two inorganic layers further comprise a second inorganic layer made of a material comprising $SiN_n$, where $0.6<n<1$.

2. The packaging structure according to claim 1, wherein the first inorganic layer is made of a material comprising $SiC_xN_y$, where $0<x\leq2$ and $0<y\leq2$.

3. The packaging structure according to claim 1, wherein the at least two inorganic layers further comprise a third inorganic layer, the third inorganic layer being on a side of the second inorganic layer away from the packaging body, or being between the second inorganic layer and the first inorganic layer; and
    the third inorganic layer is made of a material comprising $SiO_mN_g$, where $1<m\leq2$, and $0\leq g<0.7$.

4. The packaging structure according to claim 1, wherein along a direction away from the packaging body, the at least two inorganic layers have sequentially increasing refractive indexes.

5. The packaging structure according to claim 1, wherein the at least two inorganic layers comprise three inorganic layers, and along a direction away from the packaging body, refractive indexes of the three inorganic layers respectively range: from 1.3 to 1.6; from 1.4 to 1.8; and from 1.6 to 2.0.

6. The packaging structure according to claim 1, wherein the first packaging layer has a thickness between 0.3 μm and 2 μm.

7. The packaging structure according to claim 1, wherein the packaging body comprises: a color conversion layer, and the color conversion layer comprises quantum dots.

8. The packaging structure according to claim 1, wherein the packaging body comprises a light-emitting structure, the light-emitting structure comprises a light-emitting layer, and the light-emitting layer comprises quantum dots or an organic light-emitting material.

9. The packaging structure according to claim 8, wherein the light-emitting structure further comprises: a first cathode, an electron transport layer, a hole transport layer, and a first anode sequentially stacked, and wherein the light-emitting layer is disposed between the electron transport layer and the hole transport layer.

10. A display apparatus, comprising: the packaging structure according to claim 1.

11. A display apparatus, comprising: the packaging structure of claim 7, wherein the display apparatus further comprises: a plurality of light-emitting devices each configured to emit light of a preset color; and
    the color conversion layer comprises a plurality of light-exiting parts each corresponding to one of the light-emitting devices and disposed on a light-emitting side of a corresponding light-emitting device, and wherein each light-exiting part is configured to receive light emitted by the corresponding light-emitting device, and emit light of the same color as or a different color from the preset color.

12. The display apparatus according to claim 11, wherein the light-emitting device is disposed between the color conversion layer and the first base.

13. The display apparatus according to claim 11, wherein the display apparatus further comprises: a second base opposite to the first base, the light-emitting device is disposed on the second base, the color conversion layer is disposed on a side of the first base facing the second base, and the first packaging layer is disposed between the color conversion layer and the light-emitting device.

14. The display apparatus according to claim 11, wherein the preset color is blue, the plurality of light-exiting parts of the color conversion layer constitute a plurality of repetitive units, each repetitive unit comprising: a red light-exiting part configured to emit red light, a green light-exiting part configured to emit green light, and a blue light-exiting part configured to emit blue light.

15. The display apparatus according to claim 11, wherein the display apparatus further comprises:
    a second packaging layer covering the plurality of light-emitting devices; and
    a receiving structure layer on a side of the second packaging layer away from the light-emitting devices, wherein the receiving structure layer has a plurality of receiving slots therein in one-to-one correspondence with the plurality of light-emitting devices, and the light-exiting part is disposed in the receiving slot.

16. The display apparatus according to claim 11, wherein the display apparatus further comprises:
    a color filter layer on a side of the color conversion layer away from the light-emitting devices, wherein the color filter layer comprises a plurality of color filter parts each corresponding to one of the light-exiting parts and having the same color as light emitted from a corresponding light-exiting part; and
    a black matrix on the side of the color conversion layer away from the light-emitting devices, wherein an orthogonal projection of at least a part of each light-exiting part on the first base does not overlap an orthogonal projection of the black matrix on the first base.

17. A method for fabricating a packaging structure, comprising:
    forming a packaging body on a first base; and
    forming a first packaging layer on a side of the packaging body away from the first base, wherein forming the first packaging layer comprises: sequentially forming at least two inorganic layers, wherein the at least two inorganic layers comprise a first inorganic layer closest to the packaging body, and the first inorganic layer contains carbon atoms and nitrogen atoms,
    wherein along a direction away from the packaging body, the at least two inorganic layers have sequentially increasing refractive indexes.

18. The method according to claim 17, wherein each inorganic layer is formed by a vapor deposition process.

19. A packaging structure, comprising:
a first base;
a packaging body on the first base; and
a first packaging layer on a side of the packaging body away from the first base and comprising at least two inorganic layers sequentially stacked, wherein the at least two inorganic layers comprise a first inorganic layer closest to the packaging body, and the first inorganic layer contains carbon atoms and nitrogen atoms,
wherein the packaging body comprises: a color conversion layer, and the color conversion layer comprises quantum dots.

\* \* \* \* \*